US010395729B2

(12) United States Patent
Perner

(10) Patent No.: US 10,395,729 B2
(45) Date of Patent: Aug. 27, 2019

(54) METHOD OF OPERATING A MEMORY UNIT SECTOR

(71) Applicant: Infineon Technologies AG, Neubiberg (DE)

(72) Inventor: Martin Perner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 22 days.

(21) Appl. No.: 16/108,243

(22) Filed: Aug. 22, 2018

(65) Prior Publication Data

US 2018/0358089 A1 Dec. 13, 2018

Related U.S. Application Data

(60) Continuation of application No. 15/949,480, filed on Apr. 10, 2018, now Pat. No. 10,083,743, which is a (Continued)

(30) Foreign Application Priority Data

Oct. 1, 2015 (DE) .................. 10 2015 116 688

(51) Int. Cl.
*G11C 7/02* (2006.01)
*G11C 11/00* (2006.01)
(Continued)

(52) U.S. Cl.
CPC ...... *G11C 11/5642* (2013.01); *G11C 11/5628* (2013.01); *G11C 11/5635* (2013.01); *G11C 16/08* (2013.01); *G06F 11/1068* (2013.01); *G06F 11/2094* (2013.01); *G06F 2201/82* (2013.01); *G11C 29/52* (2013.01); *G11C 2211/5641* (2013.01)

(58) Field of Classification Search
CPC . G11C 16/08; G11C 11/5642; G11C 11/5635; G11C 11/5628; G11C 29/52; G11C 2211/5641
See application file for complete search history.

(56) References Cited

U.S. PATENT DOCUMENTS 6,175,533 B1 1/2001 Lee
6,753,561 B1 6/2004 Rinerson et al.
(Continued)

FOREIGN PATENT DOCUMENTS

DE 10 2007 016 460 11/2007
EP 3 098 816 11/2016

*Primary Examiner* — Hien N Nguyen
(74) *Attorney, Agent, or Firm* — Dicke, Billig & Czaja, PLLC

(57) ABSTRACT

Disclosed is a memory unit that includes a sector of memory cells. The sector includes a first memory cell configured to selectively take on a state representation of a first plurality of state representations and a second memory cell configured to selectively take on at least one of a second plurality of state representations. The second plurality of state representations is different than the first plurality of state representations. An apparatus includes a processing unit and a memory unit coupled to the processing unit. The memory unit includes a sector of memory cells. Further disclosed are a method of operating a memory unit sector and a method of controlling a sector of a memory unit.

20 Claims, 4 Drawing Sheets

Related U.S. Application Data division of application No. 15/282,231, filed on Sep. 30, 2016, now Pat. No. 9,941,000.

(51) Int. Cl.
  *G11C 11/56* (2006.01)
  *G11C 16/08* (2006.01)
  *G06F 11/10* (2006.01)
  *G06F 11/20* (2006.01)
  *G11C 29/52* (2006.01)

(56) References Cited

U.S. PATENT DOCUMENTS

| | | |
|---|---|---|
| 8,170,790 B2 | 5/2012 | Lee et al. |
| 8,296,626 B2 | 10/2012 | Nazarian et al. |
| 8,547,746 B2 | 10/2013 | Tanzawa |
| 8,717,818 B1 | 5/2014 | Vigoda |
| 9,424,930 B2 | 8/2016 | Wood |
| 9,870,280 B2 | 1/2018 | Park |
| 2007/0171710 A1 | 7/2007 | Mito |
| 2014/0013033 A1 | 1/2014 | Sharon et al. |
| 2015/0310911 A1 | 10/2015 | Parthasarathy |
| 2018/0226124 A1* | 8/2018 | Perner .................. G11C 16/08 |

* cited by examiner

METHOD OF OPERATING A MEMORY UNIT SECTOR

CROSS-REFERENCE TO RELATED APPLICATION

This Utility Patent Application is a continuation application of U.S. Ser. No. 15/949,480, filed Apr. 10, 2018, which is a divisional application of U.S. Ser. No. 15/282,231 filed Sep. 30, 2016, now U.S. Pat. No. 9,941,000 and claims priority to German Patent Application No. 10 2015 116 688.7, filed Oct. 1, 2015; all of which are incorporated herein by reference.

FIELD OF TECHNOLOGY

The present application relates to the storage of information in a semiconductor memory device.

BACKGROUND

Typically, a memory unit stores information in an array of memory cells. Modern day electronic memory includes millions of memory cells, each respectively configured to store one or more bits of data (e.g., as an amount of electric charge). Retrieval of data from a memory cell can be accomplished by a read operation, wherein electric charge stored in a memory cell is provided directly to a bitline or sensed indirectly via the current of a transistor controlled by the charge. To conserve power, in one implementation, the electric charge generates a small voltage on the bitline, which is subsequently amplified by a sense amplifier into a voltage level representing a logic "1" or a "0" state by amplifying the small change in the bitline voltage into a full logic voltage swing (e.g., 2.5V for DRAM applications). In other solutions, a readout of the memory cell generates a higher or a lower read current compared to a reference current at a given readout voltage. In these solutions, the readout current compared to the reference current represents a logic "1" or a "0" state.

For example, in flash memory, the cells are made from floating-gate transistors. In single-level cells, each cell stores one bit of information. In multi-level cells, one cell can store more than one bit by choosing between multiple levels of electrical charge to apply to the transistor's floating gate. A typical memory cell resembles a Metal Oxide Semiconductor Field Effect Transistor (MOSFET). The MOSFET includes a control gate configured to control current in a channel, herein also referred to as the MOSFET channel, between a source and a drain. Depending on the type of charge responsible for the conductivity of the field-induced inversion channel, MOSFETS are nMOSFETs or pMOSFETS. In nMOSFETs, the channel below the control gate is positively doped and the active areas source and drain are negatively doped. In pMOSFETs, the doping is inverted. Due to a higher mobility of electrons compared to holes, nMOSFET devices are preferred in terms of speed. nMOSFETs are self-closing, i.e., if no voltage is applied to the gate, or the gate voltage is not exceeding a minimum threshold level, the flow of current between the drain and the source is inhibited, and, thus, the transistor is closed. By applying a positive voltage, the MOSFET turns into a conductive state. It is clear that principles of operation of a pMOSFET can be applied as well, however resulting in complementary switching behavior. In a MOSFET-based memory cell, in addition to the control gate as in other MOSFETs, there is a floating gate between the control gate and the MOSFET channel. The floating gate is insulated from the control gate. Charging the floating gate with electrons sets the transistor to a physical state where the MOSFET channel does not conduct. By definition, the memory cell is thus programmed into a logic state representing a "1". The electrons screen the electric field from the control gate, whereby a threshold voltage of the cell is increased and a higher voltage must be applied to the control gate in order to make the MOSFET channel conductive.

Removing the electrons from the floating gate or even charging the floating gate positively sets the transistor to a physical state where the MOSFET channel conducts. The memory cell is thereby erased and brought into a logic state representing a "0". The positively charged floating gate supports the build-up of the inversion channel and reduces the threshold voltage when the transistor turns on. There are many variations of flash memory cell construction and different approaches in how to inject charge onto the floating gate, such as hot electron injection or electron tunneling. There are also many variations of the flash cell construction, for example, such as providing an additional gate to separate the selection and the charge control of the floating gate.

In order to read a value from the transistor, an intermediate voltage, i.e., a voltage at a level between the threshold voltage level in a state where the floating gate is not charged and the threshold voltage level in a state where the floating gate is charged, is applied to the control gate. This voltage is called a read voltage (Vread), and is also referred to as an activation voltage, and is adjusted to a point of operation of the flash memory cell array. If the nMOSFET channel conducts at this intermediate voltage, then the floating gate is not charged with electrons. This means that at an earlier time, for example by performing an erase operation, a logic value "0" was stored in the memory cell. If the channel does not conduct at the intermediate voltage level, then the floating gate is charged with electrons. This means that at an earlier time, for example by performing a programming operation, a logic value "1" was stored in the cell. It should be understood that the representation of a logic "1" or "0" state depends on the logic circuitry used to sense the current and represent the sense level.

In a multi-level cell device, a level of charge on the floating gate represents one of multiple bits that can be stored in the cell. Accordingly, instead of merely sensing a non-zero current, an amount of current flow in the MOSFET channel is sensed in order to determine the level of charge stored on the floating gate.

Memory cells are typically organized in sectors. A sector comprises one or more wordlines configured to activate memory cells that are connected to the wordline, i.e., to set the control gate of the memory cells to an activation voltage level on the wordline. A sector comprises one or more bitlines configured to sense current flowing through memory cells connected to the bitline when activated.

Wordlines and bitlines can be subject to malfunction. For example, a resistance of a wordline can increase whereby a voltage drop across the wordline may be greater than was designed for in order for the memory sector to function properly.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof.

Rather, the primary purpose of the summary is to present some concepts of the invention in a simplified form as a prelude to the more detailed description that is presented later.

Representative implementations of devices and techniques provide a memory unit that comprises a sector of memory cells. The sector comprises a first memory cell configured to selectively take on a first plurality of state representations and a second memory cell configured to selectively take on a second plurality of state representations. In some embodiments, the second plurality of state representations differs from the first plurality of state representations.

Further provided is an apparatus that comprises a processing unit and the above-described memory unit coupled to the processing unit. Further techniques disclosed herein comprise a method of operating the sector of the memory unit. The method comprises sensing a first cell current responsive to a first wordline signal and sensing a second cell current responsive to a second wordline signal. The method further comprises, based on a difference between the first cell current and the second cell current, deriving data representative of a difference between a state of the first cell and a state of the second cell, and, in some embodiments, using the data to derive wordline status information.

Still further techniques disclosed herein comprise a method of controlling the sector of the memory unit. The method comprises setting the second wordline to a second voltage level and sensing a first current, setting the second wordline to a third voltage level and sensing a second current, and, in some embodiments, based on the first sense current and the second sense current, deriving data representative of the sector status.

This summary is submitted with the understanding that it will not be used to interpret or limit the scope or meaning of the claims. This summary is not intended to identify key features or essential features of the claimed subject matter, nor is it intended to be used as an aid in determining the scope of the claimed subject matter. Other methods, apparatus and systems are also disclosed. Those skilled in the art will recognize additional features and advantages upon reading the following detailed description, and upon viewing the accompanying drawings.

BRIEF DESCRIPTION OF THE DRAWINGS

The detailed description is set forth with reference to the accompanying figures. In the figures, the left-most digit of a reference numeral identifies the figure in which the reference numeral appears. The use of the same second and third digits in reference numerals in different figures indicates similar or identical items.

DETAILED DESCRIPTION OF THE INVENTION

As will become apparent from the following detailed description, in particular when read in conjunction with the accompanying figures, the embodiments described herein can be useful, for example, in the field of storage of data in a semiconductor memory device. More particularly, the various examples disclosed herein generally relate to methods and systems for improving the use of circuitry in a memory array. For example, reliability of use of the memory array may also be improved. In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings. Reference will now be made in detail to embodiments of the disclosure, examples of which are described herein and illustrated in the accompanying drawings.

Figure 1:
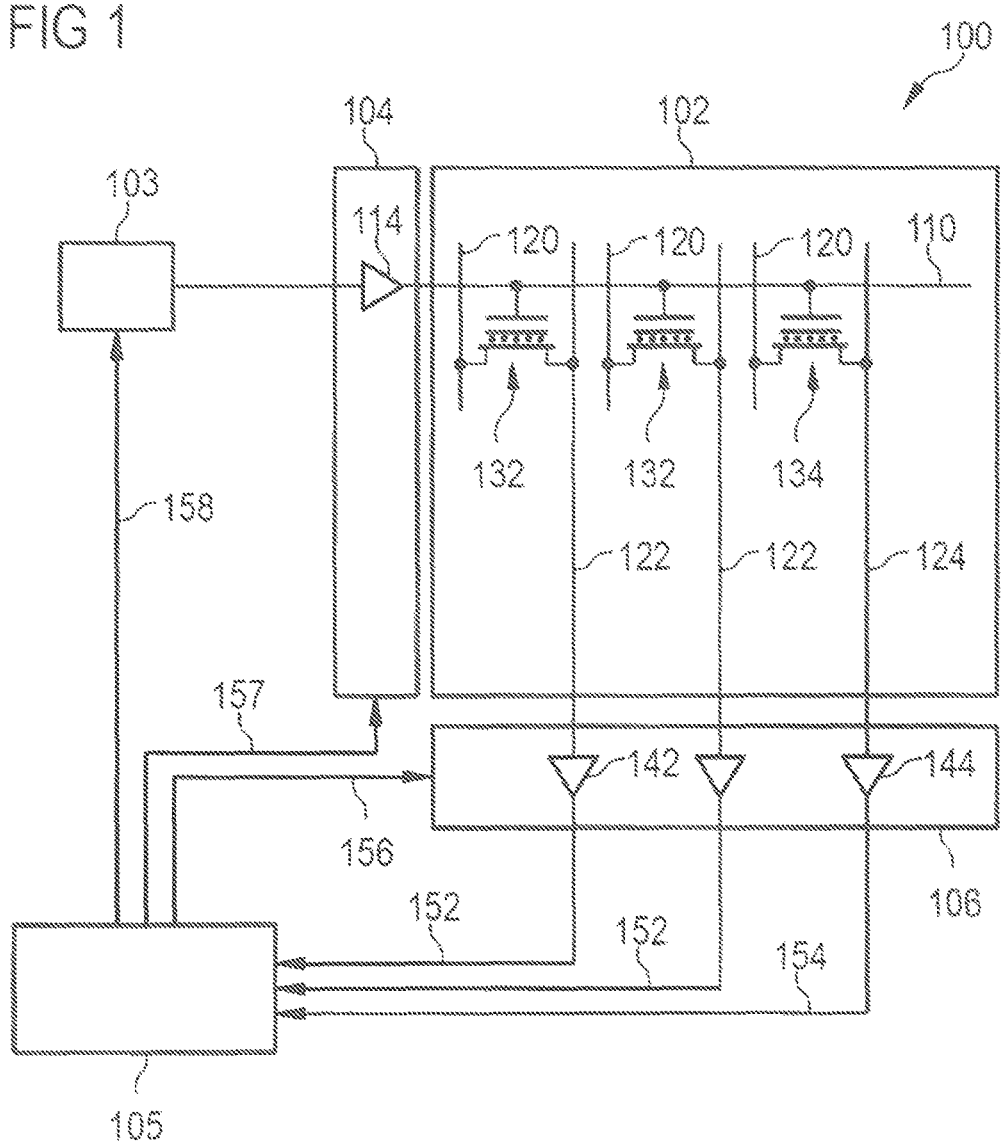
FIG. 1 illustrates a memory circuit in accordance with some embodiments.

FIG. 1 illustrates a memory circuit 100 in accordance with an exemplary embodiment. Memory circuit 100 includes a memory sector, herein also referred to as a cell array 102. The memory sector comprises wordlines and bitlines. At least some intersections of bitlines and wordlines, memory cells 132 are provided. Memory circuit 100 comprises a wordline decoder portion, herein also referred to as wordline circuit 104, that is coupled to wordlines of cell array 102. Memory circuit 100 comprises a bitline decoder portion, herein also referred to as bitline circuit 106, that is coupled to bitlines of cell array 102. Memory circuit 100, in some embodiments, is partitioned into a plurality of sectors. Boundaries between sectors, in some implementations, run parallel to wordlines.

In some embodiments, memory circuit 100 comprises a flash standard interface (FSI) 103, that is associated with and/or coupled to cell array 102 and configured to secure operation of cell array 102, for example, to schedule device repair, not only at device power up but also at least once a first failure has occurred, and thus replace a faulty device before a second (catastrophic) failure occurs that may not be compensated or corrected, for example, by using error correction code (ECC).

Some embodiments comprise a control circuit 105 configured to control settings and/or operation of one or more of flash status interface 103, wordline circuit 104, and bitline circuit 106. In some implementations, control circuit 105 is configured to receive signals from bitline circuit 106 and to process the received signals.

Wordline circuit 104 is configured to control a selection of wordlines and/or activation of selected wordlines. In some embodiments, wordlines are controlled by an address decoder provided as wordline circuit 104. Wordline circuit 104 is configured to deselect those wordlines that are not selected; wordline circuit 104 is further configured, to select selected wordlines. Wordline circuit 104 may include a voltage control circuit(s) (e.g. voltage pumps, regulators, and switches), addressing circuit(s), and line drivers 114. In some embodiments, a driver includes a chain of inverters with increasing current drive capability to charge the wordline (with relatively high capacitance) to achieve a targeted voltage in a reasonable time (e.g., less than the total read time). A driver may also include a level shifting circuit to set the wordline to a higher voltage than the core voltage of the system. For example, the level shifting circuit may be used for non-volatile memories, which may operate at a higher gate voltage for the memory cell transistor.

In some embodiments, cell array 102 is configured to be embedded, for example, as a flash memory unit in a microcontroller circuit. In some embodiments, the memory unit and/or cell array 102 comprises a storage capacity of from some 100 kilobytes to a few megabytes. It should be understood that typical future implementations may feature different storage capacities as technologies develop and user needs evolve over time. In some embodiments, in cell array 102, a row of memory cells 132 in cell array 102 may share the same wordline (e.g., 110). A memory cell (or the memory cells) thus associated with the wordline 110 is activated when its corresponding wordline is selected. Selecting a wordline 110 can comprise setting the wordline to a high voltage level as opposed to a low voltage level on other wordlines that are not selected, or vice versa.

In some embodiments, bitline circuit 106 includes one or more sense amplifiers 142, which are configured to sense one of a (i) charge, (ii) voltage, or (iii) current on the corresponding bitline. Accordingly, depending on the type of memory cell used for a particular application, the sensed signal may be a charge, a current flowing through the selected memory cell, or a voltage on the selected bitline. Sense amplifier 142 may be an analog to digital (A/D) converter in that it measures the analog signals at its input and provides a digital signal (i.e., "1" or "0") at its output. Thus, a digital output is provided by the sense-amplifier 142 corresponding to the data state stored in the memory cell (e.g., 132) that is being read via its bitline (e.g., 122). In some embodiments bitline circuit 106 further includes voltage control and/or mux circuits. For example, in some embodiments, a mux circuit in the bitline circuit 106 allows several bitlines to share the same sense amplifier. The cells of the entire wordline (e.g., wordline 110) are configured to be read by the corresponding sense amplifiers (142, 144). In some embodiments, sense amplifier 142 is configured to compare cell current to a reference current. In some embodiments, a contribution of the bitline current read can thus be determined using global cell array reference current sensing, but other methods can also be implemented such as bitline individual differential sensing, individual reference cell sensing, and so forth. Thus, at least one effect can be that individual differences in a current offset associated with respective cells, bitlines, and/or wordlines can be eliminated.

In some implementations, in cell array 102, memory cells 132 are configured to selectively represent a predetermined plurality of logic states. "Logic states", herein, are also referred to as "data states" or, for the sake of brevity, just as "states". More particularly, memory cells 132 are configured to store charge. For example, where memory cell 132 is configured to selectively represent a first plurality of states, for example, two data states "0" and "1", a first level of charge to be stored can be associated with data state "0", while a second level of charge to be stored can be associated with data state "1". For another example, in an exemplary variant of memory cell 132 where memory cell 132 is configured to selectively represent a second plurality of states, such as four data states "00", "01", "10", "11", a first level of charge to be stored can be associated with data state "00", a second level of charge to be stored can be associated with data state "01", a third level of charge to be stored can be associated with data state "10", and a fourth level of charge to be stored can be associated with data state "11". It will be understood that a memory cell 132 may be any suitable memory depending on the application, such as DRAM, SRAM, TRAM, ZRAM, FLASH, MRAM, RRAM, PRAM, etc. For example, in some embodiments memory cells 132 are provided as NMOS-FETs. For example, a memory cell could be implemented using resistive cell technology instead of a cell transistor.

In some embodiments, in memory cells 132 of cell array 102, a source terminal of memory cell 132 is coupled to a source line 120, a drain terminal of memory cell 132 is coupled to a bitline 122, and a gate terminal of memory cell 132 is coupled to a wordline 110. Upon completion of selection a wordline driver comprised in wordline circuit 104 and associated with wordline 110 provides an increased output voltage to gates of memory cells 132 coupled in series with wordline 110. Accordingly, cell current through memory cell 132 changes. In a particularly simple case, cell current is either on or off, thereby reflecting a bit value of zero and a bit value of one, respectively. In some embodiments, memory cell 132 of cell array 102, in addition to the gate, comprises a floating gate. The floating gate is configured to receive and store a level of charge that is associated with a selected one of the plurality of states to be represented by memory cell 132. To give an example, in some implementations, charge injection via tunnel oxide can be used to program memory cell 132. In an example, for the case of NMOS flash memory, described in more detail below, negative charge carriers such as electrons provide the charge on the floating gate. By controlling a level of charge provided on the floating gate, in some embodiments, an emitter collector current, herein also referred to as source drain current (Ids) or simply as cell current (Icell), can be controlled.

In some embodiments, using control of the charge state of the floating gate of memory cell 132, a threshold voltage of memory cell 132 can be programmed. At least one effect can be as follows: Wordline circuit 104 is configured to selectively output an operating voltage onto bitline 110. Thus, the gate of memory cell 132, which is coupled to selected bitline 110, is set to the operating voltage. If the operating voltage at the gate is low, in particular, if the operating voltage at the gate is below the threshold voltage of memory cell 132, then essentially no cell current can flow onto bitline 122 that memory cell 132 is coupled to. Upon selective activation of the wordline 110 at a high output voltage, in particular at a level above the threshold value, cell current can flow onto bitline 122. Thus, the information held in memory cell 132 is selectively provided to the bitline 122 associated with the respective memory cell 132. It should be understood that, depending on the type of technology used, the memory cell can be configured to provide a charge, voltage, or current to the associated bitline 122.

In some implementations, there is latency between selecting a wordline, driving a wordline voltage, opening a transistor, driving a static current level and determining a cell state based on cell current in a sense amplifier. This latency is typically determined by an RC time constant associated with a capacity of the wordline and the bitline involved. In some implementations, the latency is taken account of when controlling the memory unit. In particular, a number of latency clock cycles, herein also referred to as wait states, between a data request and a cells state determination can be predetermined sufficiently to provide sufficient time that is commensurate with the latency.

Cell array 102 comprises, in addition to a first type memory cell 132, a second type memory cell 134. In some implementations, memory cells within one sector are first type memory cells 132 and second type memory cells 134. While first type memory cell 132 is configured to selectively store a first plurality of states using a first plurality of state representations, second type memory cell 134 is configured to store one of a second plurality of states using a second plurality of state representations. In some embodiments, the first plurality of states and the second plurality of states are the same. For example, both first type memory cells 132 and second type memory cells 134 are configured to store, as in one example of memory cell 132 as described above with reference to FIG. 1, one bit, i.e., either a value "0" or a value "1". In some implementations, the first plurality of states and the second plurality of states are not the same. For example, the first type memory cells may be configured to store two bits, i.e., selectively represent four values "00", "01", "10" and "11", while the second type memory cells are configured to store one bit, i.e., either a value "0" or a value "1". It should be understood that the number of states described herein is merely to give an example. The person skilled in the art may design first type memory cells 132 and second type memory cells 134 so as to be configured to store a different number of states than included in the examples. In some embodiments, the second type memory cells 134 are pre-programmed. In other embodiments, second type memory cells 134 can be programmed during operation of memory circuit 100. For example, in some embodiments, both first type memory cells and second type memory cells are provided as flash memory cells of a same flash memory sector, and second type memory cells 134 can be erased together with first type memory cells 132 of the same flash memory sector. In some implementations, second type memory cells 134 and first type memory cells 132 can be programmed along with one another.

In a variant according to some embodiments, cell array 102 comprises, in addition to a first type memory cell 132, a second type memory cell 134, wherein first type memory cell 132 is configured to selectively store a first plurality of states using a first plurality of representations, and wherein second type memory cell 134 is non-volatile. In some embodiments a state of second type memory cell 134 is permanent, i.e., second type memory cell 134 cannot be erased and/or programmed. In some embodiments second type memory cell 134 differs from first type memory cell 132 in both aspects, i.e., second type memory cell 134 is configured to store one of a second plurality of states using a second plurality of state representations that differs from the first plurality of state representations used to selectively store a state in first type memory cell 132, and second type memory cell 134 is non-volatile whereas first type memory cell 132 can be erased and programmed.

In some embodiments, for example, both the first type memory cell 132 and the second type memory cell 134 may comprise a substrate having a source, a drain and a channel between the source and the drain. Further, the memory cell may comprise a control gate opposite the channel in the substrate and a floating gate isolated in a space between the substrate and the control gate and configured to bear a charge. In effect, charge on the floating gate can screen an electric field provided between a control gate and the channel in the substrate. The channel can be conductive. The channel's conductivity is determined by the electric field. At a given source-drain voltage, the stronger the electric field provided at the substrate is, the more current that flows in the channel. Therefore, at a given control voltage applied to the control gate of the memory cell, the more charge is provided on the floating gate, and the less current flows in the channel. In particular, if sufficient charge is provided on the floating gate, essentially no current may flow in the channel. Thus, where the memory cell's control gate is coupled to the wordline as is the case with the first type memory cells 132 and the second type memory cells 134 in FIG. 1, at a given wordline voltage applied to the memory cell's control gate, charge added on the floating gate decreases the current in the channel, i.e., the cell current. In other words, charge added on the floating gate raises the threshold voltage for cell current to flow. At least in some implementations, first type memory cell 132 and second type memory cell 134 can differ from one another in respect to the amount of charge provided on the floating gate. Thus, while a voltage applied between source and drain is the same for both memory cells, a same voltage provided at the control gate of the respective memory cell 132, 134 can still cause a different amount of current to flow in the cells. As will be described in more detail below, using a current measurement, first type memory cells 132 can thus be distinguished from second type memory cells 134.

In some alternate implementations, first type memory cell 132 and second type memory cell 134 differ structurally from one another such that a same voltage provided at the control gate of the respective memory cell 132, 134, even if the amount of charge on the floating gate of both memory cells 132 and 134 is essentially the same, can cause a different amount of current to flow in the cells, while a voltage applied between source and drain is also the same for both memory cells.

In further describing first and second type memory cells 132, 134, reference will now be made to FIG. 3 that illustrates a diagram that relates gate voltages to cell logic states in accordance with some implementations, for example, in flash memory as just described in an exemplary implementation, or, for another example, in resistive memory storage.

First type memory cell 132 is configured to selectively take on a first plurality of state representations 320, while second type memory cell 134 is configured to take on one in a second plurality of state representations 340.

The first plurality of state representations 320 comprises a first cell threshold voltage level 322 that separates a continuum of first representations, all of a logic state "0", that require a gate voltage equal to or above the first threshold voltage 322 for cell current to flow from a continuum of second representations, all of a logic state "1", that require the gate voltage to be below the first threshold voltage 322 in order to ensure flow of cell current. Thus, applying a voltage at a read voltage level 330 above the first threshold voltage level 322 to the control gate, the memory cell is associated with the first state (logic "0"). As an example of a second representation, the second plurality of state representations 340 comprises a second cell threshold voltage 342 that separates first representations (gate voltages above the second threshold voltage 342) that are associated with the first state (logic "0") from second representations (gate voltages below the first threshold voltage 342) that are associated with the second state (logic "1"). The second plurality of state representations 340 differs from first plurality of state representations 320. In the example, both first cell threshold voltage 322 of first type memory cell 132 (below a cell-programmed voltage level 321) and second cell threshold voltage 342 of second type memory cell 134 differ by a threshold voltage difference ΔU. In particular, second cell threshold voltage 342 of second type memory cell 134 is above first cell threshold voltage 322 of first type memory cell 132.

Figure 3:
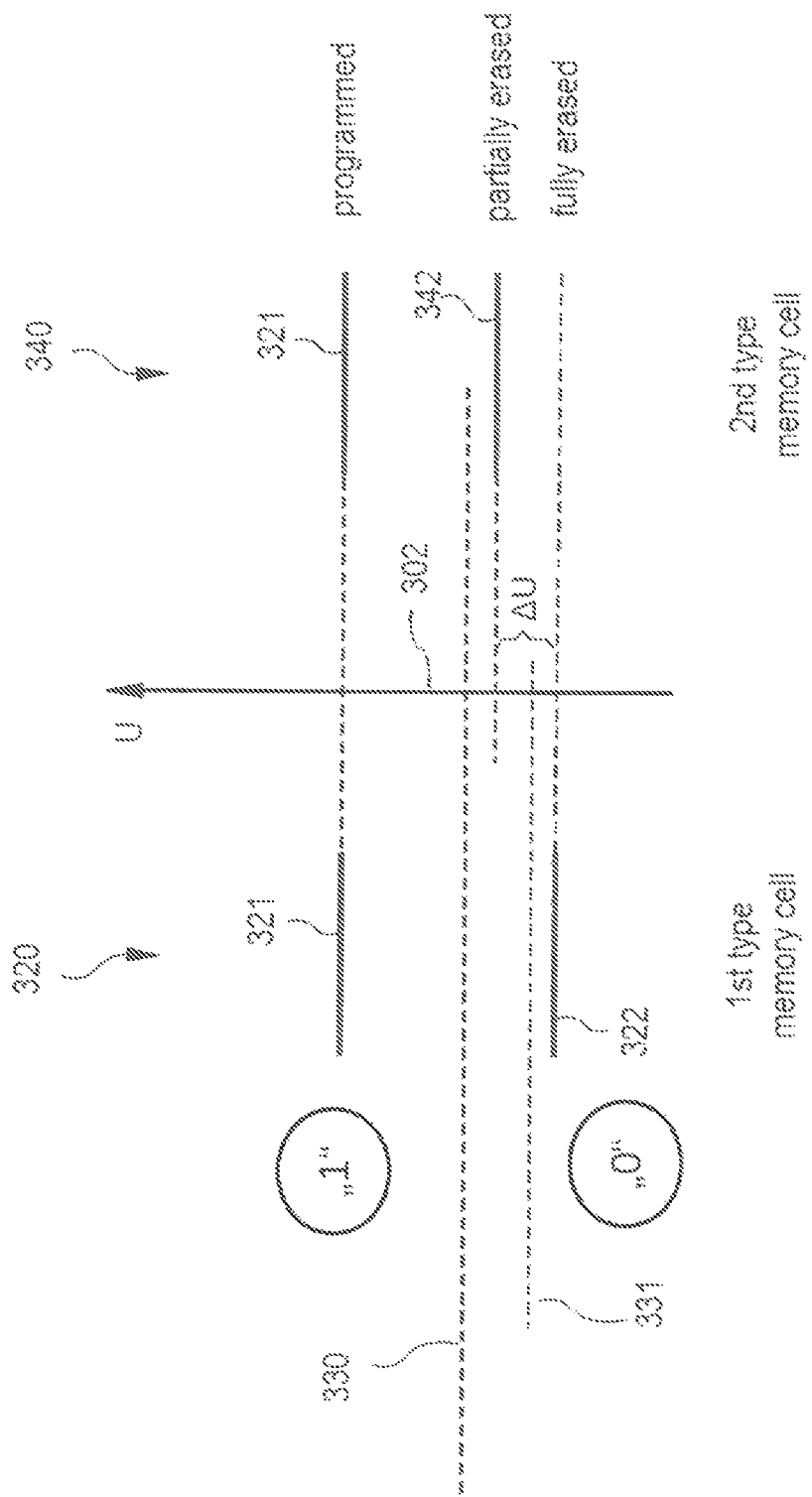
FIG. 3 illustrates a diagram of cell states versus gate voltage in accordance with some implementations.

Thus, FIG. 3, on the left hand side at 320, illustrates the exemplary first cell threshold voltage level 322 of the first type memory cell, such as the first type memory cell 132 in FIG. 1, vis-à-vis a cell-programmed voltage level 321. In some embodiments, the cell-programmed voltage level 321 can be achieved by storing a cell-programmed amount of charge on the floating gate. In some embodiments, the threshold voltage level 322 is achieved by storing a first amount of charge on the floating gate. The first amount of charge is insufficient, however, to block, at a predetermined read voltage applied at the control gate of the first type memory cell and indicated by broken line 330, the first type memory cell's channel from conducting current. In other words, the first type memory cell, when applying the predetermined read voltage level 330 is associated with the logic state "0" that is represented by a non-zero cell current. Should the read voltage drop from the level 330 to a weak read voltage level 331 still above the first cell threshold voltage level 322, still, the amount of charge on the first type memory cell's floating gate would be insufficient to screen the electrical field from affecting the channel of the first type memory cell to block the flow of cell current and, still, the memory cell of the first type would be associated with the logic state "0".

Further, FIG. 3, on the right hand side at 340, illustrates the exemplary threshold voltage level 342 of a second type memory cell, such as the second type memory cell 134 in FIG. 1, vis-à-vis the cell-programmed voltage level 321. The second type memory cell's threshold voltage level 342 is achieved by storing a second amount of charge on the floating gate that, in the exemplary embodiment, is more than the first amount of charge stored on the floating gate of the first type memory cell 132. Like in the case of the first type memory cell, the second amount of charge is also insufficient to block, at the predetermined read voltage 330 applied at the control gate of the second type memory cell, the second type memory cell's channel from conducting current. In other words, the second type memory cell's threshold voltage level 342 is insufficiently high to block the current and is therefore is also associated with logic state "0" represented by a non-zero cell current. Should the read voltage drop from the level 330 to the weak read voltage level 331, still above the first cell threshold voltage level 322 but below the second cell threshold voltage level 342, the amount of charge on the second type memory cell's floating gate would be sufficient to screen the electrical field from affecting the channel of the second type memory cell. Therefore, the channel would block the flow of cell current and the memory cell of the second type would be associated with the logic state "1".

At least one effect can thus be that the first threshold voltage 322 defines the first plurality of state representations to differ from the second plurality of state representations in that gate voltages in a voltage interval ΔU between the first threshold voltage level 322 and the second threshold voltage level 342, for example the weak read voltage 331, in the case of the first type memory cell 132, are associated with the first state (logic "0"), while in the case of the second type memory cell 134, these gate voltages are associated with the second state (logic "1").

In the example shown in FIG. 3, it should be noted that, due to a greater amount of charge on the floating gate of the second type memory cell 134 than the amount of charge on the floating gate of the first type memory cell 132, the representation of the logic state "0" in terms of cell current differs from one type of memory cell to the other. In particular, in the case of the second type memory cell 134, a smaller cell current represents the logic state "1" than in the case of the first type memory cell 132. At least one effect can be that, in a case where the read voltage provided on the wordline to the control gate of memory cells 132, 134 is somewhat below the predetermined read voltage level, for example at the level of the second read voltage 331, while the cell current of the first type memory cell 132 keeps flowing, the cell current of the second type memory cell 134 will be blocked. In other words, based on a detection of cell current, while the logic state of the first type memory cell 132 is detected as "0", the logic state of the second type memory cell 134 is detected as "1", even though the charge on the floating gate was provided to represent a predetermined logic state of "0". Where the predetermined logic state "0" is known and the logic state "1" is detected, a conclusion can be drawn that the voltage applied at the second type memory cell's control gate was below the predetermined read voltage. This information can be used to control further operation of the memory cells, for example, by increasing the read voltage provided on the wordline or by transferring data stored in the first type memory cells 132 to other memory cells and by blocking operation of the first type memory cells 132 to ensure that an expected further decrease in read voltage does not cause data loss.

While the above is described assuming that the first type memory cell 132 and the second type memory cell 134 are structurally identical so that a difference in cell current can only be caused by a difference in charge on the respective floating gate, a person skilled in the art can contemplate other implementations and techniques where the memory cells of the first type and of the second type are not structurally identical, or at least vary about a same design value due to variations and errors in manufacturing. As will be seen below with reference to FIG. 4, the variations can be captured in a statistical view of multiple cells and their associated cell currents at a given read voltage. Further, the variations can be taken into account by allowing for variations of the amount of charge stored on the floating gate of the cells to represent a same logic state "0"; further described below as "soft-shaping" of current distributions. In a typical implementation of the present teaching, however, the variations of charge stored on the floating gate of memory cells 132 that are all of the first type will be small, when compared with the difference in the amount of charge stored on the floating gate of a first type memory cell 132 and the amount of charge stored on the floating gate of a second type memory cell 134. Further, while the variations of amount of charge stored on floating gates of memory cells of the same type are directed to reduce any difference in threshold voltage so as to provide a same response in terms of cell current to a same read voltage applied to each memory cell's control gate, the difference of the amount of charge stored by a first type memory cell 132 and stored by a second type memory cell 134 is, by predetermining a corresponding difference ΔU in threshold voltage between the first type memory cell 132 and the second type memory cell 134, to provide a statistically significant different response in terms of cell current to a same read voltage applied to each memory cell's control gate. In fact, as described above, the response can be so different that different logic states are determined when the read voltage applied at the cell's control gates drops significantly below the predetermined or other design read voltage.

The second plurality of state representations 345 differs from first plurality of state representations 320. In the example both, first cell threshold voltage 322 of first type memory cell 132 and second cell threshold voltage 342 of second type memory cell 134 differ by a threshold voltage difference ΔU. In particular, second cell threshold voltage 342 of second type memory cell 134 is smaller than first cell threshold voltage 322 of first type memory cell 132.

In some implementations, wordline circuit 104 is configured to have line driver 114, via wordline 110, set the gate of first type memory cell 132 and the gate of second type memory cell 134 to one wordline activation voltage. If this wordline activation voltage is greater than first cell threshold voltage 322 of first type memory cell 132 and smaller than second cell threshold voltage 342 of second type memory cell 134, then a cell current Icell1 from first type memory cell 132 will represent first type memory cell 132 to be in the second state, while a cell current Icell2 from second type memory cell 134 will represent second type memory cell 134 to be in the first state.

A corresponding consideration is valid for the case where the wordline driver 114 provides too low of a gate voltage to the memory cells. Other implementations can be contemplated where the threshold voltage for both types of memory cells 132 and 134 is the same, while the level of cell-programmed voltage differs from one type of cell to the other. This situation can arise where the memory cell is "weakly" programmed, i.e., where the charge on the cell's floating gate is not completed to a cell-programmed charge amount. Accordingly, a decrease of the threshold voltage of weakly programmed second type memory cells compared to strongly programmed first type memory cells will increase the cell current Icell.

The same considerations are also valid as to other embodiments of memory concepts. For example, in resistive memory, a resistivity is a key parameter to distinguish between states and thus represents a plurality of states. It should be understood that the principles discussed above with respect to exemplary flash memory cells can be applied to any non-volatile dependency of conductivity that enables a separation of programmable states and, thereby a differentiation between the programmable states, provided the different states can be tested. In some implementations, the test is performed, as described above with respect to exemplary flash memory cells, by applying an appropriate read voltage to perform a read operation.

In some embodiments, bitline circuit 106 is configured to receive sense signals on bitlines 122, 124. For example, if in cell array 102, one wordline 110 is activated, then cell current Icell1, Icell2 of memory cells 132, 134 coupled to that wordline 110 flows in bitlines 122, 124. Sense amplifiers 142, 144 of bitline circuit 106 receive the cell current Icell1, Icell2 as sense signals and output a corresponding digital read signal DS1, DS2, via signal lines 152, 154, to control circuit 105. In some embodiments, sense amplifiers 142, 144, on a reference input line, receive a reference current Iref. Sense amplifier 142, 144 can be configured to compare the cell current received on bitline 122, 124 to the reference current Iref.

Control circuit 105, in some implementations, is configured to process the read signals in order to derive, based on information on which wordline was activated, a corresponding state of memory cell 132, 134. In accordance with concepts disclosed herein, in some implementations, control circuit 105 is configured to determine if there is a discrepancy between the state determined for the first type memory cell and the state determined for the second type memory cell. If control circuit 105 detects a discrepancy, then, in some embodiments, control circuit 105 is configured to flag a malfunction. In some implementations, control circuit 105 is configured to interpret the discrepancy as an indication of a malfunction related to wordline 110. In some embodiments, another component that may be coupled to control circuit 105 to receive the flag can be configured to interpret the discrepancy as an indication of a malfunction, for example, in wordline 110. A malfunction may result, for example, from deterioration of performance of line driver 114 and/or from deterioration of conductivity of wordline 110, at least in a portion of wordline 110 that connects line driver 114 to the gate of second type memory cell 134. Accordingly, in some implementations, control circuit 105 is configured to then output the flag and/or another malfunction signal to flash status interface 103. In some embodiments, flash status interface 103 is configured, upon receipt of the fault signal, to store data that is stored in memory cells 132 coupled to wordline 110 at other locations, and/or to avoid future use of wordline 110.

The above-described techniques can be varied. For example, in some embodiments, first type memory cells 132 are configured to store, as in an exemplary variant of memory cell 132 described above with reference to FIG. 1, two bits, i.e., a first charge value to represent "00", a second charge value to represent "01", a third charge value to represent "10" and a fourth charge value to represent "11". The state stored in memory cell 132 is read by using line driver 114 to activate wordline 110 and by using sense amplifier 142 to sense a cell current Icell1 through first type memory cell 132 in comparison to a reference current Iref. Meanwhile, second type memory cells 134 are configured to store one bit, i.e., either a fifth charge value to represent "0" or a sixth charge value to represent value "1". At least one of the fifth charge value and the sixth charge value are selected such that a threshold voltage VTH2 is not equal to any of threshold voltage VTH1 to distinguish between representations of different states "00", "01", "10" and "11".

For example, in some embodiments, a floating gate of the first type memory cell 132 can either not be charged or can be charged to a first predetermined level of charge. When applying a wordline activation voltage to the gate of the first type memory cell, then depending on whether the wordline activation voltage is above a first threshold voltage VTH1 or not can distinguish between sensing a state wherein cell current cannot flow (DS1=0) and sensing a state where cell current can flow (DS1=0). Meanwhile, the second type memory cell 134 can be charged to a second predetermined level of charge that may differ from the first predetermined level of charge such that the second level of charge on the floating gate of the second type memory cell 134 provides for a second threshold voltage VTH2 that, for example, is slightly above the first threshold voltage VTH1 provided by the first predetermined level of charge on the first type memory cell 132. At least one effect can be that a same wordline activation voltage applied to the first type memory cell 132 and the second type memory cell 134 can provide a different response in terms of cell current. Thus, an effect can be that a drop in voltage, for example, because of the degradation of functionality of wordline 110 over time can be noticed by a decrease in cell current through second type memory cell 134 before the degradation affects cell current through first type memory cell 132 in such a way that the sensed state differs from the programmed state of the first type memory cell 132.

In some embodiments, second type memory cell 134 is non-volatile. In some embodiments, second type memory cell 134 is pre-programmed. In some implementations, for example, pre-programming of second type memory cell 134 is performed during manufacturing of memory circuit 100. In some implementations, pre-programming of second type memory cell 134 is performed at a first initialization of a project including memory circuit 100, for example, at a manufacturer location prior to delivery of the products for use by customer. In some implementations, second type memory cell 134 is embedded in memory circuit 100 in a way that second type memory cell 134 cannot be erased. At least one effect can be that a deterioration of functionality in memory circuit 100, in particular related to wordline 110, can be derived based upon a cell current through second type memory cell 134 that is sensed or detected in response to a voltage supplied to second type memory cell 134, wherein wordline 110 is used to supply the voltage. In particular, a statistical analysis of cell current through second type memory cell 134 caused by multiple instances of setting second type memory 134 to a sense voltage, in order to, for example, derive a mean cell current, a mean cell state, a mean variation of cell current and/or a mean variation of cell state, can be used to detect a change in functionality of wordline 110. It should be understood that, because of a deterioration of the wordline driver and/or the wordline 110, a voltage set at second type memory cell 134 is lower than in a case of a properly functioning wordline driver and wordline 110. Nevertheless, cell current through first type memory cell 132 may still be indicative of the state that first type memory cell 132 was set to. In contrast, however, cell current through second type memory cell 134, since second type memory cell 134 is pre-programmed to a state that has a different threshold voltage, when set to the reduced voltage level of deteriorated bitline 110, may not represent the pre-programmed state of second type memory cell 134. In some implementations, it is beneficial to check for the functional integrity of the sense amplifier 144. In such case, a first sensing is checking for the logic value in the sensing point that is common with the sense amplifiers 142, but a second sensing with opposite value is forced to validate the sensing capability and to exclude any stuck-at error operation leading to a constant sensing value not depending from the actual analog value to be sensed.

It should be understood that, because of a deterioration of the wordline driver and/or the wordline 210, a voltage set at second type memory cell 234 is lower than in a case of a properly functioning wordline driver and wordline 210. Nevertheless, cell current through first type memory cell 232 may still be indicative of the state that first type memory cell 232 was set to. In contrast, however, cell current through second type memory cell 234, since second type memory cell 234 is pre-programmed to a state that has a different threshold voltage, when set to the reduced voltage level of deteriorated bitline 210, may not represent the pre-programmed state of second type memory cell 234.

Figure 2:
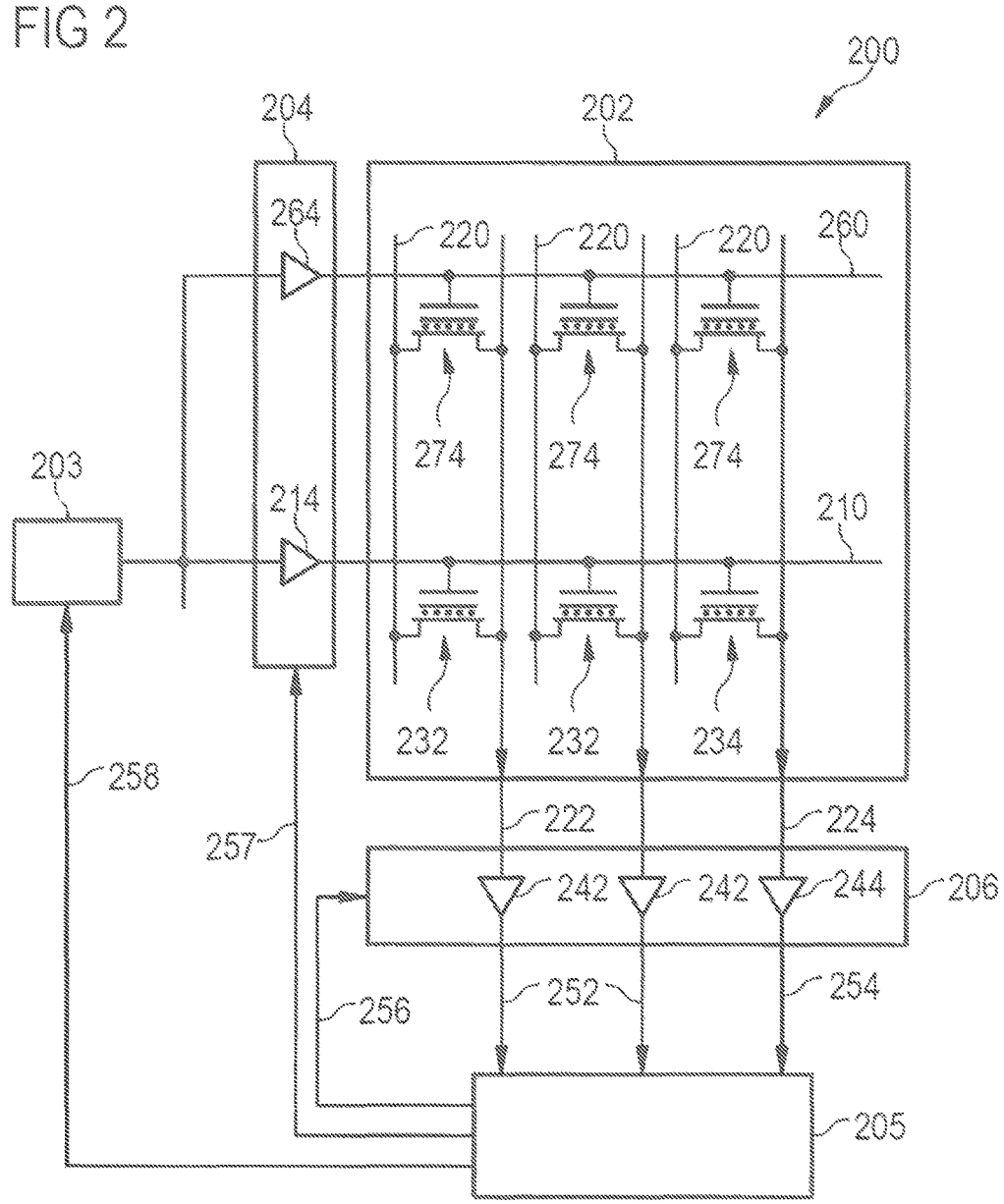
FIG. 2 illustrates a memory circuit in accordance with some embodiments.

FIG. 2 illustrates a memory circuit 200 in accordance with an exemplary embodiment. As known in the art, the memory sector comprises wordlines and bitlines. At least at some intersections of bitlines and wordlines, memory cells 232 are provided. Memory circuit 200 is similar to memory circuit 100 illustrated in FIG. 1. In particular, memory circuit 200 includes at least one memory sector herein also referred to as a cell array 202. Cell array 202 comprises memory cells 232, 234, 274. Memory cells 232, 234, 274 are, for example, located at intersections of bitlines 222, 234 and wordlines 210, 260. In some embodiments, for example, memory cells 232 are configured to store charge associated with a data state (e.g., "1" or "0"). Memory circuit 200 comprises a wordline decoder portion, herein also referred to as wordline circuit 204, that is coupled to wordlines of cell array 202. Memory circuit 200 comprises a bitline decoder portion, herein also referred to as bitline circuit 206, that is coupled to bitlines of cell array 202. Memory circuit 200, in some embodiments, is partitioned into a plurality of sectors. Boundaries between sectors, in some implementations, run parallel to wordlines.

Memory circuit 200 comprises a sector drive circuit 203 that is associated with cell array 202 and configured to secure operation of cell array 202 like, or at least, similar to what is described above with reference to flash status interface 103 of cell array memory circuit 100. Some embodiments comprise a control circuit 205 configured to control settings and/or operation of one or more of sector drive circuit 203, wordline circuit 204, and bitline circuit 206. In some implementations, control circuit 205 is configured to receive signals from bitline circuit 206 and to process the received signals.

A source terminal of memory cell 232 is coupled to a source line 220 and a drain terminal of memory cell 232 is coupled to a bitline 222. In some embodiments, memory cells 232 comprise a floating gate, for example, as described above with reference to memory cells 132 in cell array 102 of FIG. 1. A threshold voltage VTH1 of memory cell 232 can be programmed using charge injection via oxide tunneling. Thus, using a charge state of the floating gate, in some embodiments, an emitter collector current, herein also referred to as source drain current or simply as cell current Icell1, can be controlled. The information in memory cell 232 is selectively readable by activation of an associated bitline 222. It will be understood that a memory cell 232 may be any suitable memory depending on the application, such as DRAM, SRAM, TRAM, ZRAM, FLASH, MRAM, RRAM, PRAM, etc. In some embodiments, memory cells 232 are provided as NMOS-FETs. Depending on the type of technology used, the memory cell is configured to provide a charge, voltage or current to an associated bitline 222.

In some embodiments, a row of memory cells 232, 234 may share the same wordline (e.g., wordline 210). A memory cell (or the memory cells associated with the wordline) is activated when its corresponding wordline is selected. In this regard, a wordline decoder, herein also referred to as wordline circuit 204, controls the selection and activation of the wordlines, respectively. The wordline circuit 204 may include a voltage control circuit(s) (e.g. voltage pumps, regulators, and switches), addressing circuit(s), and drivers.

In some embodiments, wordline circuit 204 comprises a line driver 214, 264 that can include one or a chain of inverters with increasing current drive capability to charge the wordline (with relatively high capacitance) to achieve a targeted voltage in a reasonable time (e.g., less than the total read time). Wordline circuit 204 may also include a level shifting circuit to set the wordline to a higher voltage than the core voltage of the system. For example, the level shifting circuit may be used for non-volatile memories, which may operate at a higher gate voltage for the memory cell transistor.

Memory circuit 200, in bitline circuit 206, also includes one or more sense amplifiers 242, which are configured to sense one of a (i) charge, (ii) voltage, or (iii) current on the corresponding bitline. Accordingly, depending on the type of memory cell used for a particular application, the sensed signal may be a charge, a current flowing through the selected memory cell, or a voltage on the selected bitline. A sense amplifier 242 may be an analog to digital (A/D) converter in that it measures the analog signals at its input and provides a digital signal (i.e., "1" or "0") at its output. Thus, a digital output is provided by the sense-amplifier 242 corresponding to the data state stored in the memory cell (e.g., 232) that is being read via its bitline (e.g., 222). Bitline circuit 206 may include voltage control and/or mux circuits. For example, in some embodiments (not shown), a mux circuit in the bitline circuit 206 allows several bitlines to share the same sense amplifier. The cells of the entire wordline (e.g., wordline 210) are read by the corresponding sense amplifiers 242. In some embodiments, sense amplifier 242 is configured to compare cell current to a reference current. In some embodiments, a contribution of the bitline current read can thus be determined using global cell array reference current sensing, but other methods can also be implemented such as bitline individual differential sensing, individual reference cell sensing and so forth. Thus, at least one effect may be that individual differences in a current offset associated with respective cells, bitlines, and/or wordlines can be eliminated.

In some embodiments, cell array 202 is configured to be embedded, for example, as a flash memory unit in a microcontroller circuit. In some embodiments, the memory unit and/or cell array 202 comprises a storage capacity of from 100 kilobytes to a few megabytes. It should be understood that typical future implementations may feature different storage capacities as technologies develop and needs for storage evolve over time.

In some implementations, cell array 202 comprises, in addition to a first type memory cell 232, a second type memory cell 234. In some implementations, while first type memory cell 232 is configured to store one of a first plurality of states, second type memory cell 234 is configured to store one of the second plurality of states. In some embodiments the second plurality of states is the same as the first plurality of states; for example, both, the first plurality of states and the second plurality of states provide one bit that can either be set to a value "1" or to a value "0". In other embodiments the second plurality of states differs from the first plurality of states; for example, the first plurality of states provides a pair of bits that can selectively set to the values "00", "01", "10", and "11", while the second plurality of states provides one bit that can either be set to a value "1" or to a value "0".

In some implementations, a first plurality of state representations associated with the first type memory cell differs from a second plurality of state representations associated with the second type memory cell. For example, in some embodiments, while a floating gate of the first type memory cell 232 can either not be charged or can be charged to a first predetermined level of charge, the second type memory cell 234 can be charged to a second predetermined level of charge that differs from the first predetermined level of charge. At least one effect can be that, as described above with reference to FIG. 1, the second level of charge on the floating gate of the second type memory cell 234 provides for a second threshold voltage VTH2 that, for example, is slightly above the first threshold voltage VTH1 provided by the first predetermined level of charge on the first type memory cell 232. At least one effect can be that a same activation voltage applied by line driver 214 via wordline 210 to the first type memory cell 232 and the second type memory cell 234 can provide a different response in terms of cell current Icell1, Icell2. Thus, an effect can be, that a drop in voltage, for example, because of the degradation of functionality of wordline 210 over time can be noticed by a decrease in cell current through second type memory cell 234 before the degradation affects cell current through first type memory cell 232.

In some embodiments, second type memory cell 234 is non-volatile. In some embodiments, second type memory cell 234 is pre-programmed. In some implementations, for example, pre-programming of second type memory cell 234 is performed during manufacturing of memory circuit 200. In some implementations, pre-programming of second type memory cell 234 is performed at a first initialization of a project including memory circuit 200, for example, at a manufacturer location prior to delivery of the products for use by customer. In some implementations, second type memory cell 234 is embedded in memory circuit 200 in a way that second type memory cell 234 cannot be erased. At least one effect can be that a deterioration of functionality in memory circuit 200, in particular related to wordline 210, can be derived based upon cell current Icell2 through second type memory cell 234 that is sensed or detected in response to a voltage supplied to second type memory cell 234, wherein wordline 210 is used to supply the voltage.

In some embodiments, wordline circuit 204 includes a second line driver 264 configured to selectively drive a second wordline 260. Cell array 202 comprises a plurality of second type memory cells 274 that are coupled to second wordline 260. At least one effect can be that sector drive circuit 203 can be controlled to selectively activate second wordline 260 so as to gather operational data indicative of correct operation, of faulty operation, and in particular, of sector drive circuit 203. In some embodiments, control circuit 205 is configured to control sector drive circuit 260 so as to enable a collection of operational data received from bitline circuit 206. In some implementations, control circuit 205 is configured to analyse the operational data. In particular, in some implementations, control circuit 205 is configured to perform a statistical analysis of the operational data. In some embodiments, control circuit 205 is configured to control sector drive circuit 203 based on a result of the analysis of the operational data.

In some implementations, memory circuit 200 is configured to detect a malfunction of sector drive circuit 203. In some embodiments, control circuit 205 is configured to have memory circuit 200 perform a statistical analysis of cell current Icell2 through second type memory cell 274 that includes multiple instances of setting second type memory 274 to an activation voltage VWL, in order to, for example, derive a mean cell current, a mean cell state, a mean variation of cell current and/or a mean variation of cell state. Repeated performance of the statistical analysis can be used, when comparing results of the statistical analysis with historic results. In some implementations, the historic results are stored at the beginning of the life time of the memory circuit 200, for example, prior to delivery of the memory circuit 200 to a customer. The statistical analysis can be used, for example, to detect a change in functionality of sector drive circuit 203 or, in case of any parametric operation point deviations (e.g., Vread, Iref), in the global sensing circuitry 206.

Figure 4:
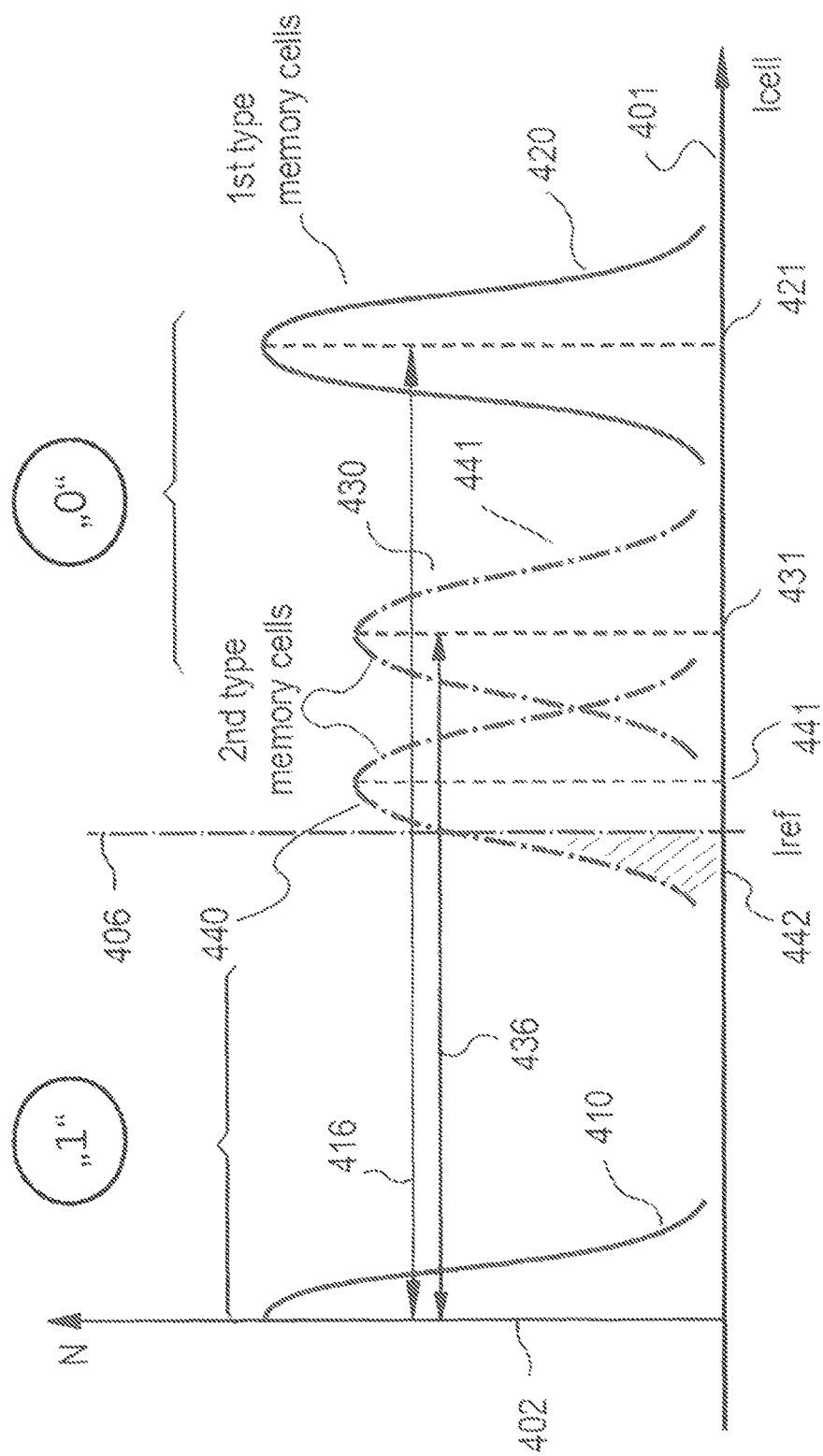
FIG. 4 illustrates a diagram of distribution of cells versus cell current according to some embodiments.

FIG. 4 schematically illustrates an exemplary diagram of exemplary distribution of cell currents occurring in first and second type memory cells according to some implementations. The graph shows cell current Icell along an abscissa 401 and number of cells along an ordinate 402. First, the graph will be generally discussed. Then, the graph will be discussed with reference to embodiments as illustrated in FIG. 2. In the graph of FIG. 4, four distributions can be distinguished.

A first distribution 410 is formed by memory cells, both of the first type and the second type 132 and 134, that are associated with a logic state "1". A predetermined read voltage applied to each memory cell's control gate causes a cell current Icell to flow. However, given that the memory cells' channels are essentially blocked by the voltage at the memory cells' control gates, there is only a small leakage current to be detected as cell current Icell. Accordingly, the distributions maximum is, at least in some embodiments, at zero cell current.

A second distribution 420 is formed by memory cells of the first type 132 that are associated with a logic state "0".

The predetermined read voltage supplied to each memory cells' control gates is well above the first threshold voltage level described above with reference to FIG. 3. In other words, charge provided on the first type memory cells floating gate screens the electric field of the voltage applied to the control gate from the channel region formed in the memory cells substrate. Therefore, cell current Icell can flow and be detected. A maximum of the second distribution 420 at 421 is far apart from a maximum of the first distribution 410 at zero cell current.

In FIG. 4, a current difference is indicated at 416. A reference current Iref, at 406, marks a separation between the logic state "1" and the logic state "0", and it should be noted that the maxima, both of the first distribution 410 and of the second distribution 420, are sufficiently far from the reference current Iref that the tail of each distribution towards the reference current Iref does not extend across the separation at 406. This means that essentially all memory cells that are supposed to be in the logic state "1", when the predetermined read voltage is applied, cause cell current Icell to flow that correctly represents the logic state "1". Further, this means that essentially all memory cells of the first type that are supposed to be in the logic state "0", when the predetermined read voltage is supplied, cause cell current Icell to flow that correctly represents the logic state "0". Even if the read voltage supplied to the gate of memory cells in the tail of the second distribution towards the reference current Iref should be somewhat below the predetermined read voltage, still essentially none of the memory cells will provide cell current Icell less than the reference current Iref. Therefore, in such a case, the detected cell current Icell will still correctly represent the logic state "0" of the first type memory cells 134.

A third distribution 430 is formed by memory cells of the second type 134 that are associated with the logic state "0". As described above when discussing the second distribution 420, the predetermined read voltage supplied to each memory cells' control gates is well above the first threshold voltage level described above with reference to FIG. 3. In other words, charge provided on the first type memory cells floating gate screens the electric field of the voltage applied to the control gate from the channel region formed in the memory cells substrate. Therefore, cell current Icell can flow and be detected. However, a maximum of the third distribution 430 at 431 is less far apart from a maximum of the first distribution 410 at zero cell current than the maximum of the second distribution 420 at. 421. A tail of the third distribution towards the reference current Iref may almost extend across the separation at 406.

A fourth distribution 440 is formed by memory cells of the second type 134 that are associated with the logic state "0". In contrast to the first, second and third distributions 410, 420 and 430, the fourth distribution 440 is provided by setting the control gates of the second type memory cells 134 to a lower read voltage than the predetermined read voltage used to read the logic states stored in the cells of the first, second and third distribution. Accordingly, the fourth distribution 440 has a maximum for a cell current that, at 441, is below the maximum of the third distribution 430 also formed by memory cells of the second type 134, and a tail 442 of the distribution towards the reference current Iref extends across the reference current Iref at 406. Therefore, the detected cell current in some cases, that is, for some memory cells, incorrectly represents the logic state "1" for the second type memory cells 134.

Now, implementations of the distributions illustrated in FIG. 4 will be described with reference to embodiments, for example, as illustrated in FIG. 2. In some implementations, if the cell current Icell1, Icell2 received at the sense amplifier 242, 244 is less than the reference current Iref, then sense amplifier 242, 244 outputs a read signal "1", while, if the received cell current Icell1, Icell2 is at least as large as the reference current Iref, then sense amplifier 242, 244 outputs a read signal "0". Thus, the digital read signals DS1, DS2, on each signal line 252, 254, represent cell current Icell1, Icell2 sensed on the associated bitline 222, 224. Since there is a statistical variation from wordline to wordline, from bitline to bitline, and from cell to cell, digital read signals DS1, DS2 are functions of the associated bitline's cell current Icell1, Icell2 and represent a detected logic state "1" or "0" stored in the memory cells, i.e., DS1(Icell1)=0 or DS1(Icell1)=1, and DS2(Icell2)=0 or DS2(Icell2)=1. It should be understood that the number of cells of the first type coupled to a wordline, in some implementations, is in the thousands (not shown) rather than two (as shown in FIGS. 1 and 2), while the number of second type memory cells coupled to the same wordline, in some implementations, can be tens or more (not shown) rather than one (as shown in FIGS. 1 and 2). Thus, distributions of numbers of cells with different cell current can be formed.

As described above, Icell1 and Icell2 are not necessarily the same from one cell to another, and over a life time of memory circuit 200, Icell1 and Icell2 are not even necessarily the same for the same cell. In some implementations, statistical variations can be compensated by a method called "soft-shaping", whereby a uniform or an otherwise customized cell current (or threshold voltage) distribution is achieved. Soft-shaping comprises an application of a sequence of one or more erase pulses. Given a desired low threshold voltage VTH, first, a broad erase distribution is formed by performing a bit-unspecific erase, whereby a last bit associated with the wordline reaches a desired low threshold voltage VTH. Next, the soft-shaping is performed bit-specifically by providing slight programming pulses to selected memory cells. Thereby, electron charge is injected to the floating gate of the memory cells. The charge increases the threshold voltage VTH of the selected memory cell(s). In the sequence of parallel soft-shaping each bit is excluded as soon as the bit's threshold voltage has reached a predetermined or expected mean value of the threshold voltage VTH. Repeatedly performing a sequence of such a re-programming on cells distributed according to the erase distribution 420, provides, for example, singulated distributions 430 and 440.

For a first example, shown in FIG. 4, a first distribution 410 of a first number of memory cells where DS1=1 is formed by memory cells, both of the first type and the second type 232 and 234, that are associated with a logic state "1". A predetermined read voltage applied to each memory cells' control gate keeps a cell current Icell from flowing. Accordingly, hardly any cell current Icell1 flows through first bitline 222 to be sensed by first sense amplifier 242 of bitline circuit 206. First sense amplifier 242 compares the current received from first bitline 222 to reference current Iref and outputs a first digital signal DS=1. Taking account of all memory cells of the first type coupled to wordline in the logic state "1", thus, the first distribution 410 builds up and peaks at cell current Icell=0 (see FIG. 4, ordinate 411). However, given that the memory cells' channels are essentially blocked by the voltage at the memory cells' control gates, there is only a small leakage current to be detected as cell current Icell. Accordingly, the distributions maximum is, at least in some embodiments, at zero cell current.

For a second example, shown in FIG. 4, a second distribution 420 of a second number of memory cells where DS1=0 is formed by memory cells of the first type 232 that are associated with a logic state "0". The predetermined read voltage supplied to each memory cells' control gates is well below the first threshold voltage level described above with reference to FIG. 3. In other words, charge provided on the first type memory cells floating gate screens the electric field of the voltage applied to the control gate from the channel region formed in the memory cells substrate. Therefore, cell current Icell can flow and be detected. Accordingly, cell current Icell1 flows through bitline 222 to be sensed by first sense amplifier 242 of bitline circuit 206. First sense amplifier compares the current received from bitline 222 to reference current Iref and outputs digital a signal DS1=0. Taking account of all memory cells of the first type coupled to wordline in the logic state "0", thus, a second distribution 420 builds up that peaks at a large cell current Icell (see FIG. 4, broken line at reference numeral 421 on abscissa 401). A maximum of the second distribution 420, at 421, is far apart from a maximum of the first distribution 410 at zero cell current.

In FIG. 4, a current difference is indicated at 416. A reference current Iref, at 406, marks a separation between the logic state "1" and the logic state "0", and it should be noted that the maxima, both of the first distribution 410 and of the second distribution 420, are sufficiently far from the reference current Iref that a tail of each distribution towards the reference current Iref does not extend across the separation at 406. This means that essentially all memory cells that are supposed to be in the logic state "1", when the predetermined read voltage is applied, cause cell current Icell to flow that correctly represents the logic state "1". Further, this means that essentially all memory cells of the first type that are supposed to be in the logic state "0", when the predetermined read voltage is supplied, cause cell current Icell to flow that correctly represents the logic state "0". Even if the read voltage supplied to the gates of memory cells in the tail of the second distribution towards the reference current Iref should be somewhat below the predetermined read voltage, still essentially none of the memory cells will provide cell current Icell less than the reference current Iref. Therefore, in such a case, the detected cell current Icell will still correctly represent the logic state "0" of the first type memory cells 134.

For a third example, shown in FIG. 4, a third distribution 430 of a third number of memory cells where DS2=1 is formed by memory cells of the second type 234 that are associated with the logic state "0". As described above when discussing the second distribution 420, the predetermined read voltage supplied to each memory cells' control gates is well above the first threshold voltage level described above with reference to FIG. 3. In other words, charge provided on the first type memory cells floating gate screens the electric field of the voltage applied to the control gate from the channel region formed in the memory cells substrate. Therefore, cell current Icell can flow and be detected. Accordingly, cell current Icell2 flows through second bitline 224 to be sensed by second sense amplifier 244 of bitline circuit 206. Second sense amplifier 244 compares the current received from second bitline 224 to reference current Iref and outputs third digital signal DS2=1. While this procedure is performed on several second type memory cells 234, the third distribution 430 builds up and peaks at a cell current Icell a little bit above Icell=0 (see FIG. 4, broken line at reference numeral 431). However, a maximum of the third distribution 430 at 431 is less far apart from a maximum of the first distribution 410 at zero cell current than the maximum of the second distribution 420 at 421. A tail of the third distribution towards the reference current Iref may almost extend across the separation at 406.

For a fourth example, shown in FIG. 4, a fourth distribution 440 of a fourth number of memory cells where DS4=0 is formed by memory cells of the second type 234 that are associated with the logic state "0". In contrast to the first, second and third distributions 410, 420 and 430, the fourth distribution 440 is provided by setting the control gates of the second type memory cells 234 to a lower read voltage than the predetermined read voltage used to read the logic states stored in the cells of the first, second and third distribution. Accordingly, the fourth distribution 440 has a maximum for a cell current that, at 441, is below the maximum of the third distribution 430 also formed by memory cells of the second type 134, and a tail 442 of the distribution towards the reference current Iref extends across the reference current Iref at 406. Accordingly, cell current Icell2 flows through second bitline 224 to be sensed by second sense amplifier 244 of bitline circuit 206. Second sense amplifier 244 compares the current received from second bitline 224 to reference current Iref and, typically, outputs digital a signal DS2=1. However, taking account of all memory cells of the second type 234 coupled to the wordline, some have a cell current Icell2 that is too low to give rise to a digital signal DS2=0, i.e., to be detected to represent the logic state "0". Thus, the fourth distribution 440 builds up and peaks at a medium cell current Icell (see FIG. 4, broken line at reference numeral 441 on abscissa 401). However, the detected cell current in some cases, that is, for memory cells in the tail portion 442 of the fourth distribution 440, incorrectly represents the logic state "1" for the second type memory cells 234.

Still with reference to FIG. 4, comparing cell currents provided in the first example with cell currents provided in the second example, peak 411 of the first distribution and peak 421 of the second distribution are spaced apart a first type cell current difference (see FIG. 4, line at reference numeral 416). Comparing cell currents provided in the third example with cell currents provided in the first example, peak 431 of the third distribution and peak 411 of the first distribution are spaced apart by a smaller cell current difference, wherein the third distribution is closer to the reference current Iref. Comparing the first type cell current difference 416 to the second type cell current difference 436, the latter is less than the former, since the threshold voltage VTH2 of second type memory cell 234 is lower than the threshold voltage VTH1 of first type memory cell, i.e., VTH2<VTH1. At least one effect, therefore, can be that in an event of a wordline voltage VWL being lower than it should be, a probability of the second type memory cell 234 to provide a signal DS2=1 instead of DS2=0 is greater than a probability of the first type memory cell 232 to provide a signal DS1=1 instead of DS1=0. At least in some implementations, if, for example, control circuit 205 performs an analysis on the fourth distribution as obtained during an ordinary operation of memory circuit 202 and determines that the distribution is shifted versus Iref, then the shift can be interpreted as an indication of a malfunction in line driver 214 or wordline 204. Thus, the second type memory cell 234 can serve as an early indicator of a decrease in performance.

The techniques described herein with reference to detecting a read voltage that is below the predetermined read voltage can also be used to enable a detection of a read voltage that is greater than the predetermined read voltage. In an alternate implementation, the second type memory cell can be configured to represent the second logic state "1" and be configured and/or programmed as, for example, described above with reference to flash memory cells, so as to shift the distribution of cell current Icell2 representative of the predetermined logic state "1" towards the reference cell current Iref. As a consequence, when applying too high a read voltage to the control gate of the second type memory cells, the distribution's tail towards the reference cell current Iref may cross the reference cell current, i.e., some second type memory cells can be detected to represent the first logic state "0" that differs from the predetermined logic state "1". Such detection can be used as an indicator of too high a read voltage on the wordline and, for example, ensue further processing in order to avoid loss of data.

In some embodiments, in addition to the second type memory cells, third type memory cells are provided and configured to be used as described above with reference to the second type memory cells. The third type memory cells differ from the second type memory cells in that the cells are functionally complementary: For example, as described above with reference to the figures, the second type memory cells may be configured to enable a detection of a decrease of the activation or read voltage on the wordline to which the second type memory cells are coupled, wherein the detection is based on an activation voltage where the first type memory cells do not provide such indication. In contrast, the third type memory cells may be configured to enable a detection of an increase of the activation or read voltage on the wordline to which the third type memory cells are coupled, wherein the detection is based on an activation voltage where the first type memory cells do not provide such indication.

The techniques described herein with reference to detecting a difference in a distribution of cell current of second type memory cells of a memory integrated circuit between a first reference distribution, for example established prior to a first time use of the memory integrated circuit and a later time, possibly years after the first time use, can also be used to detect a direction of change in activation voltage. In some implementations a first determination of the distribution of cell currents of second type memory cells is performed at a first time and a second determination of the distribution of cell currents of second type memory cells is performed at a second time after the first time. A shift of the distribution is indicative of a change of activation voltage/read voltage provided to the cells' control gates.

While distribution of cell current Icell according to the exemplary histogram shown in FIG. 4 can correspond to a sensing profile of any non-volatile flash or resistive random access memory (RAM), the distribution of cell current Icell is not limited to this kind of memory. It should also be understood that the techniques disclosed herein are not limited to arrangements of memory cells in a plane, but can also be applied in a three-dimensional arrangement or memory cells. For example, the techniques could be implemented in three-dimensional resistive memory architectures.

Now, further embodiments and implementations according to the invention in various aspects will be described.

In a first aspect the invention encompasses a memory unit comprising at least one sector of memory cells. In some embodiments the memory cells of the sector each share the same sector address that differs from another sector's address in the memory unit. In some embodiments the sector comprises at least three lines. In some embodiments the three lines include at least a first wordline and at least a first bitline.

In some embodiments, the memory cells are configured to be set to a logic state corresponding to a binary representation by at least one bit. Thus, the logic state is one logic state in a plurality of logic states that encompasses as many logic states as can be represented by the binary representation. In some embodiments, the memory cells are configured to be selectively set to one in a plurality of logic states. For example, where the memory cell can be store one bit, the memory cell can be selectively set to one of two logic states "0" and "1". For example, where the memory cell can be store two bits, the memory cell can be selectively set to one of four logic states, expressed in binary representation, "00", "01", "10" and "11". Each logic state is associated with a representation of the logic state within the memory cell. For example, in a floating gate transistor memory cell, a first predetermined amount of charge can be associated with a first logic state, while a second predetermined amount of charge can be associated with a second logic state. In particular, the first predetermined amount of charge can be associated setting a cell control gate to a predetermined read voltage and measure cell source drain current responsive to the predetermined read voltage. Thus, the plurality of logic states is associated with a plurality of representations of the plurality of logic states.

In some embodiments the first plurality of logic states comprises a greater number of states than the second plurality of logic states. At least one effect can be that the second memory cell can be set to represent a predetermined logic state so as to provide a predetermined difference signal. In some embodiments the second memory cell is preset to a reference logic state, herein also referred to as a cell-programmed state, selected in the second plurality of logic states. In some embodiments the second memory cell is preset to represent a logic binary state "1" that, in some implementations, is non-volatile. At least one effect can be that the second memory cell can be set to a predetermined state representation that the first memory cell cannot be set to, if to represent the same logic state.

In the sector of memory cells, at least a first memory cell is configured to selectively take on a first plurality of state representations. In some embodiments, a second memory cell is configured to selectively take on a second plurality of state representations. The second plurality of state representations differs from the first plurality of state representations. At least one effect can be that a same activation signal provided to the first memory cell and to the second memory cell can be used to provide a difference signal. In some embodiments the sector is configured to provide the difference signal based on a difference of the representation of a same state between the first plurality of state representations and the second plurality of state representations.

In the sector of memory cells, the first memory cell is coupled to the first wordline and coupled to the first bitline. In some embodiments the first bitline is configured to conduct a first cell current. In some embodiments the second memory cell is coupled to either the first wordline or the first bitline, and the second memory cell is further coupled to the third line.

In some embodiments, at least one first voltage threshold to separate a representation of one logic state from a representation of another logic state is associated with the first plurality of state representations. For example, the first plurality of state representations can be provided, at a given activation voltage, by any cell current in a range of from a first cell current to a second cell current. In some embodiments, at least one second voltage threshold to separate a representation of one logic state from a representation of another logic state is associated with the second plurality of state representations. For example, the second plurality of state representations can be provided, at the given activation voltage, by any cell current in a range of from a third cell current to a fourth cell current. In some embodiments, the at least one second voltage threshold differs from any of the at least one first voltage threshold, or at least one of the third cell current and the fourth cell current differs from the first cell current and from the second cell current. At least one effect can be that the second memory cell can be used as a benchmark for performing read operations. For example, if the second memory cell's response to an activation of the first wordline in terms of cell current changes from one reading to another, then the activation voltage at a gate of the memory cell was not the same from the one reading to the another reading. Given that the second threshold voltage differs from the first threshold voltage, this change in activation voltage at the gate can be detected at the second memory cell, while it is not detected at the first memory cell. However, an underlying development that brought about the change, may later also affect the first memory cell. Thus, future changes in functionality of the first memory cell can be anticipated by observation of the second memory cells.

In some embodiments the third line is a second bitline. In some embodiments a second memory cell is coupled to the first wordline and coupled to the second bitline. In some embodiments the first wordline is configured to set a voltage at the first memory cell and at the second memory cell. In some embodiments the second bitline is configured to conduct a second memory cell current. At least one effect can be that the second bitline can be used in testing a wordline performance.

In some embodiments the third line is a second wordline. In some embodiments a second memory cell coupled to the first bitline and coupled to the second wordline. In some embodiments the second wordline is configured to set a second voltage at the second memory cell. At least one effect can be that the second wordline can be used in testing the sector, for example a sector driver circuit performance. In some embodiments the first bitline is configured to conduct a first cell current and a second cell current.

In some embodiments the second memory cell is nonvolatile. At least one effect can be that the reference state can be preserved beyond a period where the memory circuit is powered. Thus, in some implementations, the representation of the second cell logic state is never to be changed. The second cell logic state can be used as a reference in operation of the memory unit's sector of memory cells. If reading the second memory cell's state provides a logic state that differs from the pre-programmed second memory cell's logic state that is never to be changed, then the finding may indicate a malfunction, for example, of a sector driver, a wordline driver, a wordline, or other component of the memory circuit. Accordingly, measures can be taken to avoid loss of data stored in other memory cells of the memory circuit. In particular, other memory cells that the indicated malfunction can be expected to affect soon, can be evacuated from these other memory cells to be stored elsewhere, as the case may be, in other unaffected memory cells of the same sector, of the same memory circuit, or elsewhere, for example on a backup storage medium.

This description in a second aspect according to some embodiments describes an apparatus that comprises a processing unit configured to process data signals and a memory unit coupled to the processing unit. The memory unit comprises at least one sector of memory cells. In some embodiments, the memory unit is integrated with the processing unit, for example, as an embedded memory in a microprocessor. The at least one sector comprises a first memory cell and a second memory cell. In some embodiments the first memory cell is configured to selectively take on a first plurality of state representations. In some embodiments a second memory cell is configured to selectively take on a second plurality of state representations. In some embodiments, the second plurality of state representations differs from the first plurality of state representations. The processing unit is configured to control the first memory cell based on a detected second cell logic state.

As described above, for example with reference to the invention in the first aspect, in some embodiments the second plurality of state representations differs from the first plurality of state representations. At least one effect can be that the second memory cell can be set to represent a predetermined state. In some embodiments the processing unit is configured to process signals based on a predetermined second cell logic state of the second plurality of states. At least one effect can be that a same signal provided to the first memory cell and to the second memory cell can be used to provide a difference signal reflective of a difference in the logic state represented by the first memory cell and in the logic state represented by the second memory cell.

In some implementations, at least one first voltage threshold to separate a representation of one logic state from a representation from another logic state is associated with the first plurality of state representations. In some implementations, at least one second voltage threshold to separate a representation of one logic state from a representation from another logic state is associated with the second plurality of state representations. In some implementations, the at least one second voltage threshold differs from any of the at least one first voltage threshold. At least one effect can be to enable an early warning detection of malfunction in the sector, for example, if a wordline provides insufficient voltage to the gate of the second memory cell. Since an insufficiency results in the threshold voltage not being achieved and a logic state read from the second memory cell being inconsistent with the logic state that the second memory cell was programmed to be in.

In some embodiments the second plurality of state representations comprises a greater number of states the first plurality of state representations. In some embodiments the second memory cell is preset to a reference state representation selected in the second plurality of state representations.

In some embodiments the second memory cell is non-volatile. At least one effect can be that the reference state can be preserved beyond a period of powering the memory circuit. In some embodiments the at least one sector of the memory unit comprises at least three lines. In some embodiments the three lines include at least a first wordline and at least a first bitline. In some embodiments the first memory cell is coupled to the first wordline and to the first bitline. In some embodiments the first bitline is configured to conduct a first cell current. In some embodiments, the second memory cell is coupled to the third line.

In some embodiments the third line is a second bitline. In some embodiments the second memory cell is coupled to the first wordline and the second bitline. In some embodiments the first wordline is configured to set a voltage at the first memory cell and at the second memory cell. In some embodiments the second bitline is configured to conduct a second cell current.

In some embodiments the third line is a second wordline. In some embodiments a second memory cell is coupled to the second wordline and to the first bitline. In some embodiments the second wordline is configured to set a second voltage at the second memory cell. In some embodiments the first bitline is configured to conduct a first cell current and a second cell current.

In a third aspect the invention encompasses a method of operating a memory unit sector. The sector comprises a first memory cell, a second memory cell and at least three lines. The three lines include at least a first wordline and at least a first bitline. The method comprises sensing a first cell current responsive to a first wordline activation signal and sensing a second cell current responsive to a second wordline activation signal. Further the method comprises, based on a difference between the first cell current and the second cell current, deriving data representative of a difference between a logic state of the first memory cell and a second logic state of the second memory cell. In some implementations, the method comprises using the data to derive wordline status information. In some embodiments, the first memory cell is configured to selectively take on a first plurality of state representations while the second memory cell is configured to selectively take on a second plurality of state representations. The second plurality of state representations differs from the first plurality of state representations. In some implementations the method further comprises setting the first memory cell to take on one of the first plurality of state representations. In some embodiments, the method comprises setting the second memory cell to take on a different one of the second plurality of state representations. In some embodiments, the first state representation and the second state representation both represent a same logic state such as "1". In some implementations, the method comprises, based on the wordline status information, driving the wordline.

In a fourth aspect the invention encompasses a method of controlling a sector of a memory unit. The sector comprises a first memory cell, a second memory cell, a first bitline, a first wordline and a second wordline. In some embodiments, the first memory cell is configured to selectively take on a first plurality of state representations associated with a predetermined number of bits, and the first memory cell is configured to provide, when set to a first voltage level, a first cell current representative of a first cell logic state. In some embodiments, the second memory cell is configured to selectively take on a second plurality of state representations that differs from the first plurality of state representations, wherein the second memory cell is set to a predetermined one of the second plurality of state representations, and wherein the second memory cell is configured to provide a second cell current representative of a second cell logic state. In some implementations, the method comprises setting the second wordline to a second voltage level and sensing a first sense current, setting the second wordline to a third voltage level and sensing a second sense current and, based on the first sense current and the second sense current, deriving data representative of the sector status. In some implementations, the method further comprises, based on the data of the sector status, controlling the first voltage level.

Generally, the embodiments described herein can be implemented as a computer program product with a program code, the program code being operative for performing one of the methods when the computer program product runs on a computer. The program code may for example be stored on a machine readable carrier. In some embodiments a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods can be performed by any hardware apparatus. The disclosed arrangements may be implemented partially or fully in hardware using logic circuits or VLSI design. Arrangements, procedures and protocols of the described implementations may be implemented on a special purpose computer, a programmed microprocessor or micro-controller and peripheral integrated circuit element(s), an ASIC or other integrated circuit, a digital signal processor, a flash device, a hard-wired electronic or logic circuit such as discrete element circuit, a programmable logic device such as PLD, PLA, FPGA, PAL, a modem, a transmitter/receiver, any comparable device, or the like.

As used herein, like terms refer to like elements throughout the description. It is to be understood that the features of the various embodiments described herein may be combined with each other, unless specifically noted otherwise. The implementations herein are described in terms of exemplary embodiments. However, it should be appreciated that individual aspects of the implementations may be separately claimed and one or more of the features of the various embodiments may be combined.

The inventors intend the described exemplary embodiments/implementations to be primarily examples. The inventors do not intend these exemplary embodiments/implementations to limit the scope of the appended claims. Rather, the inventors have contemplated that the claimed invention might also be embodied and implemented in other ways, in conjunction with other present or future technologies. Therefore, although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. In some instances, well-known features are omitted or simplified to clarify the description of the exemplary implementations. In particular, while a memory unit is described herein, essentially, with reference to one sector, it should be understood that the memory unit can comprise more than one sector. Further, while a sector is described herein, essentially with reference to three memory cells, it should be understood that the sector can encompass many more memory cells as is known in the art. For example, while the memory sector may comprise well over one hundred columns of first bitlines and more than a dozen of second bitlines and well over one hundred wordlines with each intersection of wordline and bitline being associated with a different memory cell that is coupled at that node, wherein first type memory cells are coupled to the wordlines and to the first bitlines, whereas second type memory cells are coupled to the wordlines and to the second bitlines. Likewise, where the memory sector can comprise well over one hundred first wordlines and well over a dozen second wordlines.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. The term 'techniques,' for instance, may refer to one or more devices, apparatuses, systems, methods, articles of manufacture, and/or computer-readable instructions as indicated by the context described herein.

As used herein, the articles 'a' and 'an' should generally be construed to mean 'one or more,' unless specified otherwise or clear from context to be directed to a singular form.

As used herein, the terms 'coupled' and 'connected' may have been used to describe how various elements interface. Unless expressly stated or at least implied otherwise, such described interfacing of various elements may be either direct or indirect.

As used herein, the terms 'having', 'containing', 'including', 'with' or variants thereof, and like terms are open ended terms intended to be inclusive. These terms indicate the presence of stated elements or features, but do not preclude additional elements or features.

As used herein, the terms 'determine', 'calculate' and 'compute', and variations thereof, are used interchangeably and include any type of methodology, process, mathematical operation or technique.

As used herein, terms such as 'first', 'second', and the like, are also used to describe various elements, regions, sections, etc. and are also not intended to be limiting.

What is claimed is:

1. A method of operating a memory unit sector, comprising:
    providing the memory unit sector that includes a first memory cell configured to selectively take on a first plurality of state representations, a second memory cell configured to selectively take on a second plurality of state representations, a first wordline, a first sense amplifier and a second sense amplifier, wherein the second memory cell is preset to a reference logic state that is a first one of the second plurality of state representations;
    reading a first digital output from the first sense amplifier in response to a first wordline activation voltage, wherein the first digital output corresponds to a first cell state stored in the first memory cell;
    reading a second digital output from the second sense amplifier in response to the first wordline activation voltage, wherein the second digital output corresponds to a second cell state stored in the second memory cell; and
    based on a difference between the first digital output and the second digital output, deriving data that represents wordline status information.

2. The method of claim 1, wherein providing the memory unit sector further comprises:
    the first memory cell having a first threshold voltage corresponding to a first one of the first plurality of state representations and the second memory cell having a second threshold voltage corresponding to the reference logic state, wherein the first threshold voltage is less than the second threshold voltage, wherein the first memory cell is set to a first logic state that is the first one of the first plurality of state representations and the reference logic state is equal to the first logic state, and wherein
    if the difference between the first digital output and the second digital output represents the first memory cell is at the first logic state and the second memory cell is at a second one of the second plurality of state representations, the first wordline activation voltage is less than a predetermined read voltage and greater than the first threshold voltage.

3. The method of claim 2, comprising driving the first wordline at the predetermined read voltage if the wordline status information indicates the first wordline activation voltage is less than the predetermined read voltage and greater than the first threshold voltage.

4. The method of claim 2, comprising providing an indication of a malfunction if the wordline status information indicates the first wordline activation voltage is less than the predetermined read voltage and greater than the first threshold voltage.

5. The method of claim 2, wherein providing the memory unit sector further comprises:
    providing a third memory cell configured to selectively take on a third plurality of state representations and a third sense amplifier, wherein the third memory cell is set to the first logic state that is a first one of the third plurality of state representations and has a third threshold voltage for the first one of the third plurality of state representations that is less than the first threshold voltage;
    reading a third digital output from the third sense amplifier in response to the first wordline activation voltage, wherein the third digital output corresponds to a third cell state stored in the third memory cell, and wherein
    if the difference between the first digital output and the third digital output represents the first memory cell is at a second one of the first plurality of state representations and the third memory cell is at the first logic state, the first wordline activation voltage is less than the first threshold voltage.

6. The method of claim 5, further comprising driving the first wordline at the predetermined read voltage if the wordline status information indicates the first wordline activation voltage is less than the first threshold voltage.

7. The method of claim 5, comprising providing an indication of a malfunction if the wordline status information indicates the first wordline activation voltage is less than the first threshold voltage.

8. The method of claim 5, wherein providing the memory unit sector further comprises
    providing a fourth memory cell, wherein
    the first logic state of the first memory cell is transferred to the fourth memory cell if the wordline status information indicates the first wordline activation voltage is less than the first threshold voltage.

9. A method of operating a memory unit sector, comprising:
    providing the memory unit sector that includes a first memory cell configured to selectively take on a first plurality of state representations, a second memory cell configured to selectively take on a second plurality of state representations, a third memory cell configured to selectively take on a third plurality of state representations, a first wordline, a second wordline, a first sense amplifier, a second sense amplifier and a third sense amplifier, wherein the second memory cell is preset to a first reference logic state that is a first one of the second plurality of state representations and the third memory cell is preset to a second reference logic state that is a first one of the third plurality of state representations;
    reading a first digital output from the first sense amplifier in response to a first wordline activation voltage, wherein the first digital output corresponds to a first cell state stored in the first memory cell;
    reading a second digital output from the second sense amplifier in response to the first wordline activation voltage, wherein the second digital output corresponds to a second cell state stored in the second memory cell;

reading a third digital output from the third sense amplifier in response to a second wordline activation voltage, wherein the third digital output corresponds to a third cell state stored in the third memory cell; and based on a difference between the first digital output, the second digital output and the third digital output, deriving data that represents wordline status information.

10. The method of claim 9, wherein providing the memory unit sector further comprises:

the first memory cell having a first threshold voltage that corresponds to a first one of the first plurality of state representations, the first memory cell being set to a first logic state that is the first one of the first plurality of state representations, wherein the second memory cell has a second threshold voltage corresponding to the first reference logic state and the third memory cell has a third threshold voltage corresponding to the second reference logic state, wherein the second threshold voltage is greater than the first threshold voltage and the third threshold voltage is less than the first threshold voltage, wherein the first reference logic state is equal to the first logic state and the second reference logic state is equal to the first logic state, and wherein if the difference between the first digital output, the second digital output and the third digital output represents the first memory cell is at the first logic state, the second memory cell is at a second logic state, and the third memory cell is at the first logic state, the first wordline activation voltage is less than a predetermined read voltage and greater than the first threshold voltage.

11. The method of claim 10, further comprising driving the first wordline at the predetermined read voltage if the wordline status information indicates the first wordline activation voltage is less than the predetermined read voltage and greater than the first threshold voltage.

12. The method of claim 10, wherein deriving data that represents wordline status information comprises:

if the difference between the first digital output, the second digital output and the third digital output represents the first memory cell is at the second logic state, the second memory cell is at the second logic state, and the third memory cell is at the first logic state, the first wordline activation voltage is less than the first threshold voltage.

13. The method of claim 12, comprising providing an indication of a malfunction if the wordline status information indicates the first wordline activation voltage is less than the first threshold voltage.

14. A memory unit, comprising:

a sector of memory cells, wherein the sector includes a first memory cell, a second memory cell, a first wordline, a first bitline and a second bitline, wherein the second memory cell is preset to a reference logic state;

a first sense amplifier configured to sense a first cell state from the first memory cell in response to the first wordline activation voltage;

a second sense amplifier configured to sense a second cell state from the second memory cell in response to the first wordline activation voltage; and a control circuit configured to derive wordline status information based on a difference between the first cell state and the second cell state and to control the first wordline based on the wordline status information.

15. The memory unit of claim 14, comprising:

the first memory cell having a first threshold voltage and the second memory cell having a second threshold voltage, wherein the first threshold voltage is less than the second threshold voltage, and wherein the first memory cell is set to a first logic state and the reference logic state is equal to the first logic state, and wherein if the control circuit determines that the difference between the first cell state and the second cell state represents the first memory cell is at the first logic state and the second memory cell is at a second logic state, the wordline activation voltage is less than a predetermined read voltage and greater than the first threshold voltage.

16. The memory unit of claim 15, wherein the control circuit is configured to drive the first wordline at the predetermined read voltage if the wordline status information indicates the first wordline activation voltage is less than the predetermined read voltage and greater than the first threshold voltage.

17. The memory unit of claim 15, wherein the control circuit provides an indication of a malfunction if the wordline status information indicates the first wordline activation voltage is less than the predetermined read voltage and greater than the first threshold voltage.

18. The memory unit of claim 15, wherein the sector of memory cells further comprises a third memory cell and a third bitline, wherein the third memory cell is set to the first logic state and has a third threshold voltage that is less than the first threshold voltage; and wherein if the control circuit determines that the difference between the first cell state and the third cell state represents the first memory cell is at the second logic state and the third memory cell is at the first logic state, the first wordline activation voltage is less than the first threshold voltage.

19. The memory unit of claim 18, wherein the control circuit is configured to drive the first wordline at the predetermined read voltage if the wordline status information indicates that the first wordline activation voltage is less than the first threshold voltage.

20. The memory unit of claim 18, wherein the control circuit provides an indication of a malfunction if the wordline status information indicates the first memory cell is at the second logic state and the third memory cell is at the first logic state.

* * * * *